(12) United States Patent
Tange et al.

(10) Patent No.: US 6,338,923 B1
(45) Date of Patent: Jan. 15, 2002

(54) PHOTOLITHOGRAPHY MASK HAVING MONITORING MARKS AND MANUFACTURING METHOD THEREOF

(75) Inventors: Koji Tange; Kunihiro Hosono, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/568,536

(22) Filed: May 11, 2000

(30) Foreign Application Priority Data

Dec. 10, 1999 (JP) ............................................. 11-352046

(51) Int. Cl.[7] .............................. G06F 9/00; G06F 17/50
(52) U.S. Cl. ............................................. 430/5; 716/21
(58) Field of Search ..................... 430/5, 22; 250/584; 382/256, 274; 716/19, 20, 21

(56) References Cited

FOREIGN PATENT DOCUMENTS

JP          60-4216          1/1985

*Primary Examiner*—S. Rosasco
(74) *Attorney, Agent, or Firm*—McDermott, Will & Emery (57) ABSTRACT

A photolithography mask having monitoring marks, which is suitable for correctly monitoring the dimensions of patterns that are intended for transfer, and its manufacturing method. The photolithography mask is manufactured by plotting mask patterns that are designed on a data address unit basis by using a prescribed plotting address unit that is larger the data address unit. Monitoring marks are formed so as to correspond to all plotting grids, respectively, that are necessary for plotting of all mask patterns. Pattern edges plotted by using all different plotting grids are distributed to the monitoring marks, respectively.

12 Claims, 8 Drawing Sheets

PHOTOLITHOGRAPHY MASK HAVING MONITORING MARKS AND MANUFACTURING METHOD THEREOF

BACKGROUND OF THE INVENTION

1. Field of the Invention

The present invention relates to a photolithography mask having monitoring marks and its manufacturing method. In particular, the invention relates to a photolithography mask that is suitable for correctly monitoring the dimensions of patterns that are intended for transfer, and to a manufacturing method of such a photolithography mask.

2. Description of the Background Art

Conventionally, for the purpose of measurement of pattern accuracy or the like, techniques are known which form a monitoring mark on a photolithography mask that is used in a semiconductor device manufacturing process. For example, if a monitoring mark having a prescribed design length value is formed on a mask and the length of the mark is measured actually, the accuracy of dimension of a pattern having the above prescribed design length value can be measured.

Incidentally, among known techniques of manufacturing a photolithography mask is a technique using an electron beam (EB) plotting apparatus. In this technique, the region on a mask is divided into a pattern region and a non-pattern region by electron beam plotting. Development etc. are performed thereafter, whereby a photolithography mask having desired patterns is formed.

In designing patterns to be formed on a mask, a data address unit that measures 50 nm×50 nm, for example, is used as a unit of designing. More specifically, patterns on a mask are designed by combining squares having a size that is represented by the data address unit.

On the other hand, the EB plotting apparatus plots patterns, to increase the throughput of a plotting step, while using as a unit of plotting an address unit whose side length is an integral multiple times longer than that of the data address unit (e.g., a square of 200 nm×200 nm). More specifically, patterns are plotted on a mask by irradiating the same with an electron beam by using, as a unit of plotting, a square having a size that is represented by the plotting address unit.

Therefore, in plotting a pattern on a mask, an edge of the pattern may coincide with edges of plotting address units or may not coincide with the latter. Specifically, in the above example, there occur the following four cases:

(1) A state that a pattern edge coincides with edges of plotting address units. Such an edge position will be hereinafter called a "first edge position."

(2) A state that a pattern edge deviates inward (or outward) from edges of plotting address units by 50 nm (i.e., one data address unit). Such an edge position will be hereinafter called a "second edge position."

(3) A state that a pattern edge deviates inward (or outward) from edges of plotting address units by 100 nm (i.e., two data address units). Such an edge position will be hereinafter called a "third edge position."

(4) A state that a pattern edge deviates inward (or outward) from edges of plotting address units by 150 nm (i.e., three data address units). Such an edge position will be hereinafter called a "fourth edge position."

Therefore, when mask patterns are formed by EB plotting, patterns having the same length (e.g., 1,000 nm) include the following plural kinds of patterns:

(1) A pattern having a pattern edge at a first edge position and having the prescribed length (1,000 nm). A plotting grid for plotting such a pattern will be hereinafter called "Grid-1" and such a pattern will be called a "Grid-1 pattern."

(2) A pattern having a pattern edge at a second edge position and having the prescribed length (1,000 nm). A plotting grid for plotting such a pattern will be hereinafter called "Grid-2" and such a pattern will be called a "Grid-2 pattern."

(3) A pattern having a pattern edge at a third edge position and having the prescribed length (1,000 nm). A plotting grid for plotting such a pattern will be hereinafter called "Grid-3" and such a pattern will be called a "Grid-3 pattern."

(4) A pattern having a pattern edge at a fourth edge position and having the prescribed length (1,000 nm). A plotting grid for plotting such a pattern will be hereinafter called "Grid-4" and such a pattern will be called a "Grid-4 pattern."

In plotting patterns with an EB plotting apparatus, four kinds of plotting grids (Grid-1 to Grid-4) are realized by properly controlling EB irradiation energy for each plotting address unit and the conditions of a subsequent development process. The EB irradiation energy and other process conditions are set properly for each plotting grid required. Therefore, the pattern edge position is prone to vary from one plotting grid to another. And the lengths of a Grid-1 pattern to a Grid-4 pattern are prone to be influenced by dispersion that depends on the kind of plotting grid.

However, conventional photolithography masks are not formed with a monitoring mark in such a manner that differences in pattern length due to the use of different plotting grids are taken into consideration. Therefore, in conventional photolithography masks, differences in pattern length due to the use of different plotting grids cannot be monitored even if the dimension of a monitoring mark is measured.

SUMMARY OF THE INVENTION

The present invention has been made to solve the above described problems in the art, and a first object of the invention is therefore to provide a photolithography mask having monitoring marks for monitoring differences in pattern length due to the use of different plotting grids.

A second object of the invention is to provide a manufacturing method of a photolithography mask having such monitoring marks.

The above objects of the present invention are achieved by a photolithography mask described below. The mask includes mask patterns that are designed on a data address unit basis. The mask also includes monitoring marks corresponding to all plotting grids, respectively, that are necessary in plotting the mask patterns by using a prescribed plotting address unit that is larger than the data address unit. Further, pattern edges that are plotted by using all different plotting grids are distributed to the monitoring marks, respectively.

The above objects of the present invention are also achieved by a photolithography mask described below. The mask includes a plurality of stripe regions having a prescribed width and formed in contiguous relation to each other. Each of the stripe regions corresponds to a unit for proceeding a plotting process. The mask also includes a plurality of on-boundary monitoring marks that overlap with a boundary line between a first stripe region and a second stripe region. The plurality of on-boundary monitoring marks are provided so that each on-boundary monitoring mark is different in the ratio between a portion formed in the first stripe region and a portion formed in the second stripe region from the other on-boundary monitoring marks.

The above objects of the present invention are further achieved by a manufacturing method of a photolithography mask having mask patterns that are designed on a data address unit basis. In the manufacturing method, the mask patterns are plotted by using a prescribed plotting address unit that is larger than the data address unit. There are plotted monitoring marks corresponding to all plotting grids, respectively, that are necessary for plotting of the mask patterns so that pattern edges that are plotted by using all different plotting grids are distributed to the monitoring marks, respectively.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings. Elements common to drawings are given the same reference numerals and redundant descriptions thereof will be omitted.

First Embodiment

Figure 1:
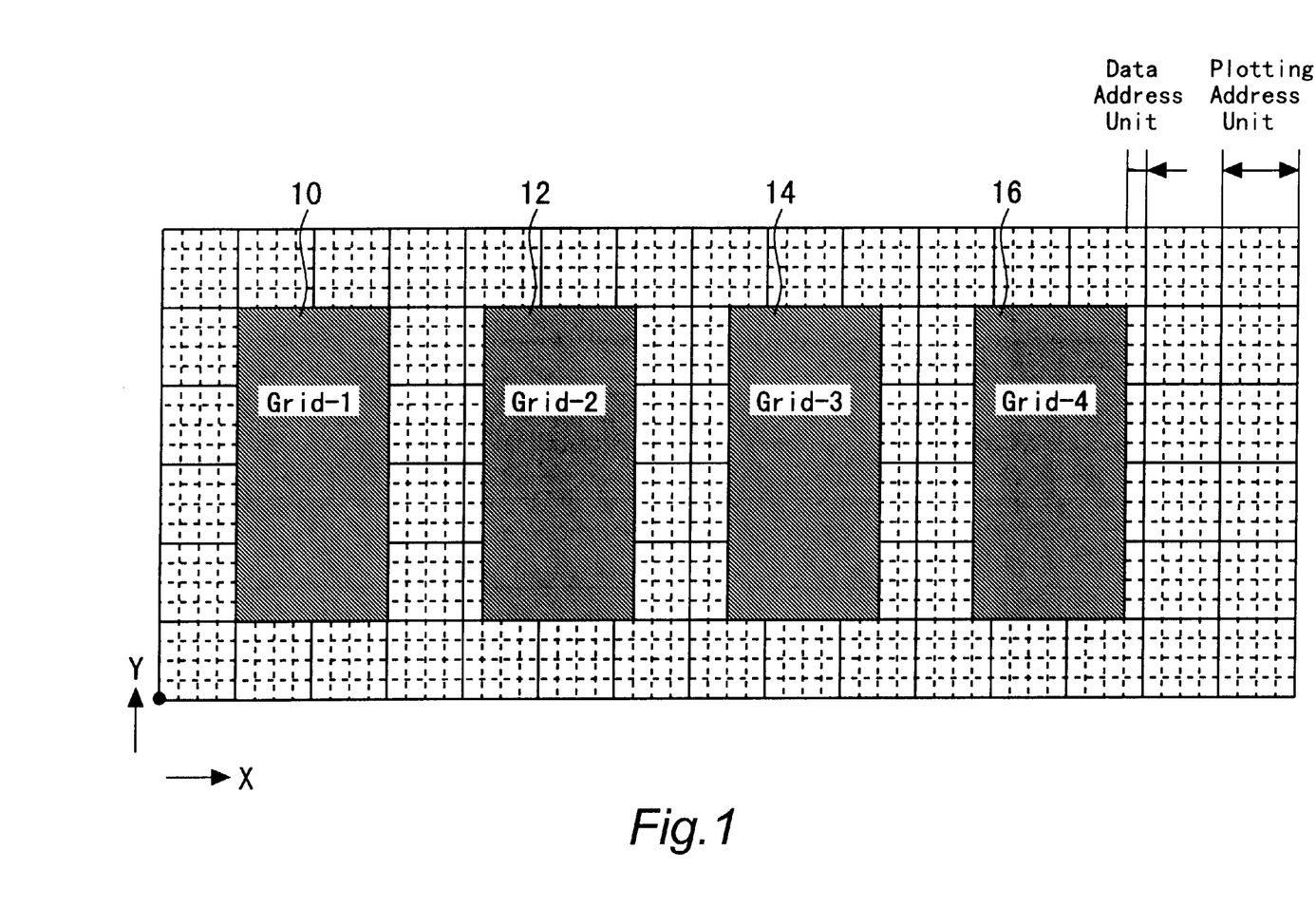
FIG. 1 is a view of assistance in explaining a relationship among patterns to be formed on a photolithography mask, data address units, and plotting address units.

FIG. 1 shows a relationship among patterns to be formed on a mask, data address units, and plotting address units. Square regions depicted by broken-lines in FIG. 1 indicate the data address units that are used in designing mask patterns. In this embodiment, the size of the data address unit is set at 50 nm×50 nm. Square regions surrounded by solid-lines in FIG. 1 indicate the plotting address units that are used in plotting mask patterns. In this embodiment the side length of the plotting address unit is set at an integral multiple times (N times) longer than that of the data address unit; specifically, the size of the plotting address unit is set at 200 nm×200 nm.

Mask patterns need to be designed by using a sufficiently small unit. This is the reason why the data address unit is made as small as about 50 nm×50 nm. Mask patterns are designed into a shape that is a combination of squares having a size that is represented by the data address unit. On the other hand, in plotting mask patterns, to increase the throughput, it is desirable to apply an electron beam to the mask in units that are relatively large. For this reason, the plotting address unit is set larger than the data address unit. It is be noted that mask patterns are written by irradiating the mask with an electron beam on a plotting address unit basis.

Four hatched FIGS. 10, 12, 14, and 16 in FIG. 1 are mask patterns having the same length in each of the X-direction and the Y-direction. For convenience of description, the point (indicated by mark "●") located at the bottom-left corner in the two-dimensional plane of FIG. 1 is made a reference point of data address units and plotting address units.

In FIG. 1, the X-coordinate of the left-hand pattern edge of the mask pattern 10 is given by the following equation. In the following description, character N appearing in equations is an integer that represents the ratio of the side length of the plotting address unit to that of the data address unit (hereinafter referred to as "address unit ratio"), and is equal to 4 in this embodiment. In the following equation, n1 is an arbitrary integer (1 in the case of FIG. 1).

$$X=\text{(side length of data address unit)} \times N \times n1$$

The X-coordinate of the left-hand pattern edge of the mask pattern 10 always coincides with that of edges of plotting address units. A plotting grid for plotting such an edge will be hereinafter called "Grid-1." Therefore, the mask pattern 10 is defined as "a pattern that measures 400 nm in the X-direction and 800 nm in the Y-direction and has been written by using Grid-1."

In FIG. 1, the X-coordinate of the left-hand pattern edge of the mask pattern 12 is given by the following equation, where n2 is an arbitrary integer and is equal to 4 in the case of FIG. 1.

$$X=\text{(side length of data address unit)} \times N \times n2 + \text{(side length of data address unit)} \times 1$$

The X-coordinate of the left-hand pattern edge of the mask pattern 12 always coincides with that of the position that deviates inward(or outward) from edges of plotting data address units by the side length of one data address unit (i.e., 50 nm). A plotting grid for plotting such an edge will be hereinafter called "Grid-2." Therefore, the mask pattern 12 is defined as "a pattern that measures 400 nm in the X-direction and 800 nm in the Y-direction and has been written by using Grid-2."

In FIG. 1, the X-coordinate of the left-hand pattern edge of the mask pattern 14 is given by the following equation, where n3 is an arbitrary integer and is equal to 7 in the case of FIG. 1.

$$X=\text{(side length of data address unit)} \times N \times n3 + \text{(side length of data address unit)} \times 2$$

The X-coordinate of the left-hand pattern edge of the mask pattern 14 always coincides with that of the position that deviates inward(or outward) from edges of plotting data address units by the total side length of two data address units (i.e., 100 nm). A plotting grid for plotting such an edge will be hereinafter called "Grid-3." Therefore, the mask pattern 14 is defined as "a pattern that measures 400 nm in the X-direction and 800 nm in the Y-direction and has been written by using Grid-3."

In FIG. 1, the X-coordinate of the left-hand pattern edge of the mask pattern 16 is given by the following equation, where n4 is an arbitrary integer and is equal to 10 in the case of FIG. 1.

$$X = \text{(side length of data address unit)} \times N \times n4 + \text{(side length of data address unit)} \times 3$$

The X-coordinate of the left-hand pattern edge of the mask pattern 16 always coincides with that of the position that deviates inward(or outward) from edges of plotting data address units by the total side length of three data address units (i.e., 150 nm). A plotting grid for plotting such an edge will be hereinafter called "Grid-4." Therefore, the mask pattern 16 is defined as "a pattern that measures 400 nm in the X-direction and 800 nm in the Y-direction and has been written by using Grid-4."

As described above, where the address unit ratio N is equal to 4, it is necessary to realize four kinds of plotting grids Grid-1 to Grid-4 and provide four kinds of pattern edge positions while applying an electron beam on a plotting address unit basis. Stated in general terms, to form mask patterns by EB plotting, it is necessary to realize plotting grids of the number of kinds that is equal to the address unit ratio N and provide N kinds of pattern edge positions while applying an electron beam on a plotting address unit basis.

Next, with reference to FIGS. 2A to 2B and 3A to 3D, a method for realizing four kinds of plotting grids Grid-1 to Grid-4 in a case where the address unit ratio N is equal to 4.

Figure 2A:
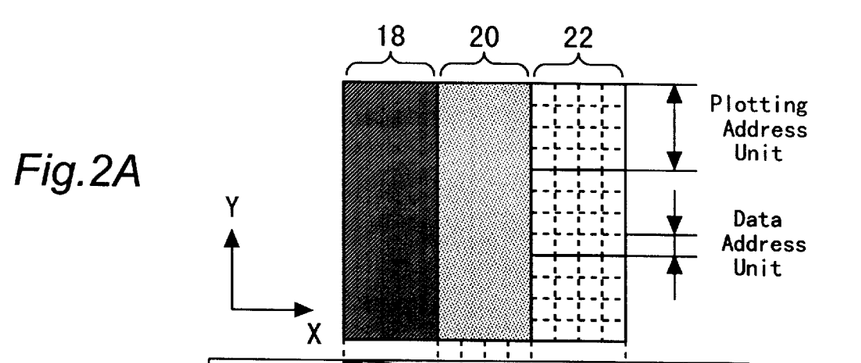
FIG. 2A is a view showing a region on a mask where pattern edges should be formed.
Figure 2B:
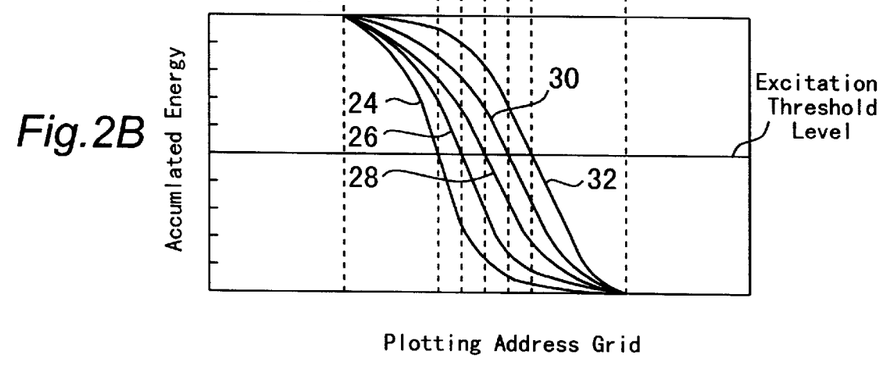
FIG. 2B is a view showing an X-direction profile of electron beam energy that is accumulated in the mask region of FIG. 2A.

FIG. 2A shows a region on a mask where pattern edges should be formed. FIG. 2B shows an X-direction profile of electron beam energy that is accumulated in the mask region of FIG. 2A.

In this embodiment, the irradiation of each plotting address unit with an electron beam is performed in such a manner that 1/N (i.e., 1/4) of the energy that is necessary for sufficient excitation is given by one-time irradiation. A region 18 shown in FIG. 2A is a region that is sufficiently excited by a repetition of N times (i.e., four times) of irradiation. The region 20 is a region where the number of times of irradiation is smaller than four. The region 22 is a region that has not been irradiated with an electron beam.

A curve 24 shown in FIG. 2B indicates an energy profile in a case where the region 18 has been irradiated four times and the region 20 has not been irradiated at all. When an electron beam is applied to the plotting address units that constitute the region 18, certain energy is also given to the region 20. The curve 24 indicates that the entire region 18 has received energy that is higher than a threshold excitation level and that the energy accumulated in the region 20 is lower than the threshold excitation level over the entire region.

Figure 3A:
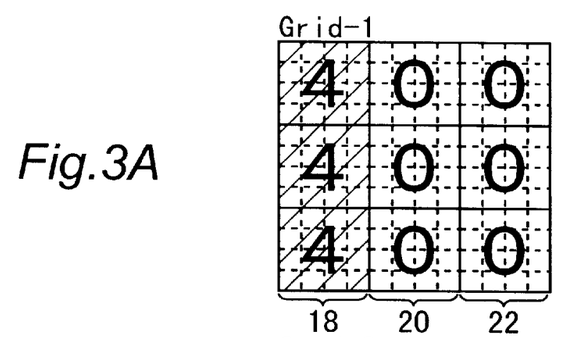
FIGS. 3A, 3B, 3D, 3E are views of assistance in explaining a relationship between pattern edges and plotting grids.

In this embodiment, the electron beam application conditions, the resist characteristics, the resist development conditions, etc. are determined so as to satisfy the conditions that are represented by the curve 24. Therefore, as shown in FIG. 3A, irradiating only the regions 18 four times can form a pattern edge at the position between the regions 18 and 20, i.e., at the position that coincides with edges of plotting address units. That is, in this embodiment, Grid-1 can be realized by the above-mentioned irradiation conditions.

A curve 26 shown in FIG. 2B indicates an energy profile in a case where the region 18 has been irradiated four times and the region 20 has been irradiated only once. The curve 26 indicates that the entire region 18 has received energy that is higher than the excitation threshold level and that the left end portion of the region 20 whose width is equal to the side length of one data address unit (i.e., 50 nm) has received energy that is higher than the excitation threshold level.

Figure 3B:
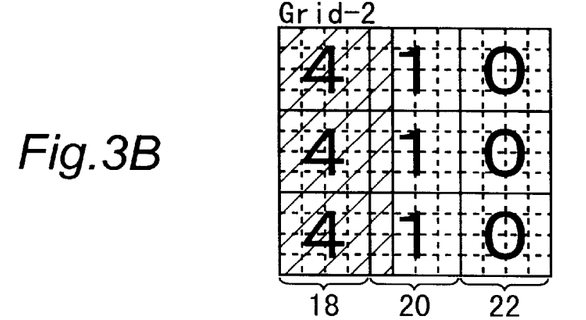

In this embodiment, the electron beam application conditions, the resist characteristics, the resist development conditions, etc. are determined so as to satisfy the conditions that are represented by the curve 26. Therefore, as shown in FIG. 3B, irradiating the regions 18 four times and the region 20 only once can form a pattern edge at the position that deviates from the region 18 by the side length of one data address unit (i.e., 50 nm). That is, in this embodiment, Grid-2 can be realized by the above-mentioned irradiation conditions.

A curve 28 shown in FIG. 2B indicates an energy profile in a case where the region 18 has been irradiated four times and the region 20 has been irradiated two times. The curve 28 indicates that the entire region 18 has received energy that is higher than the excitation threshold level and that the left half portion of the region 20 whose width is equal to the total side length of two data address units (i.e., 100 nm) has received energy that is higher than the excitation threshold level.

In this embodiment, the electron beam application conditions, the resist characteristics, the resist development conditions, etc. are determined so as to satisfy the conditions that are represented by the curve 28. Therefore, as shown in FIG. 3C, irradiating the regions 18 four times and the region 20 two times can form a pattern edge at the position that deviates from the region 18 by the total side length of two data address units (i.e., 100 nm). That is, in this embodiment, Grid-3 can be realized by the above-mentioned irradiation conditions.

A curve 30 shown in FIG. 2B indicates an energy profile in a case where the region 18 has been irradiated four times and the region 20 has been irradiated three times. The curve 30 indicates that the entire region 18 has received energy that is higher than the excitation threshold level and that the left-hand 3/4 portion of the region 20 whose width is equal to the total side length of three data address units (i.e., 150 nm) has received energy that is higher than the excitation threshold level.

Figure 3D:
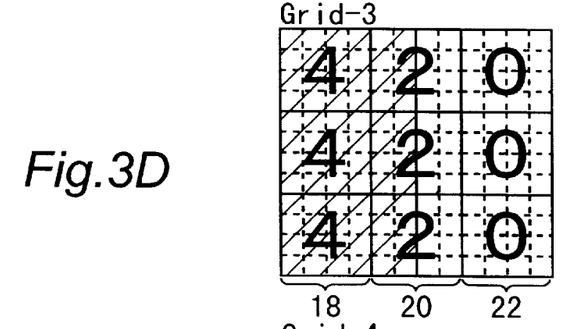
Figure 3E:
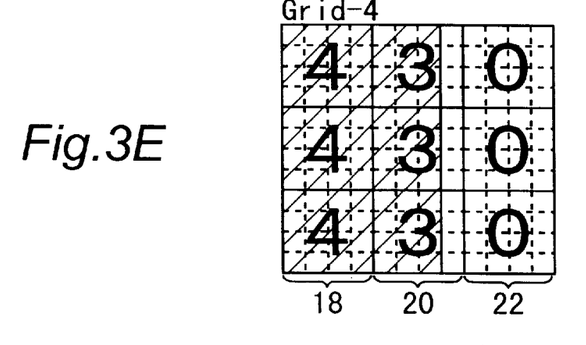

In this embodiment, the electron beam application conditions, the resist characteristics, the resist development conditions, etc. are determined so as to satisfy the conditions that are represented by the curve 30. Therefore, as shown in FIG. 3D, irradiating the regions 18 four times and the region 20 three times can form a pattern edge at the position that deviates from the region 18 by the total side length of three data address units (i.e., 150 nm). That is, in this embodiment, Grid-4 can be realized by the above-mentioned irradiation conditions.

A curve 32 shown in FIG. 2B indicates an energy profile in a case where both of the regions 18 and 20 have been irradiated four times and the region 22 has not been irradiated at all. Like the profile of the curve 24, the profile of the curve 32 indicates that a pattern edge is formed at the boundary of the two regions. Therefore, the above-mentioned irradiation conditions can realize Grid-1 and form a pattern edge between the regions 20 and 22.

As described above, according to this embodiment, all of the four kinds of plotting grids that are necessary for plotting of designed mask patterns can be realized by controlling the number of times of electron beam application. The above-described four kinds of plotting grids are ones for deviating a pattern edge in the X-direction. Plotting grids for deviating a pattern edge in the Y-direction can also be realized based on the same principle. In the following, four kinds of plotting grids for deviating a pattern edge in the Y-direction will also be called Grid-1, Grid-2, Grid-3, and Grid-4 in the same manner as the plotting grids relating to the X-direction.

Next, a plotting method for forming mask patterns over the entire surface of a photolithography mask will be described with reference to FIG. 4.

Figure 4:
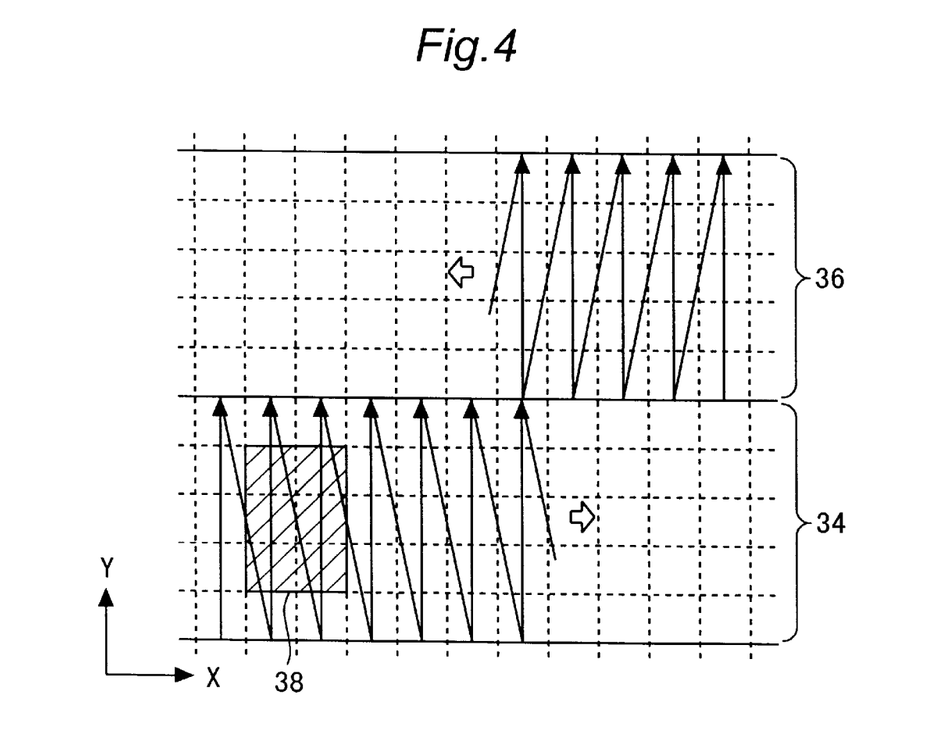
FIG. 4 is a view showing example plotting loci of an electron beam for forming mask patterns on entire surface of the photolithography mask.

FIG. 4 shows example plotting loci of an electron beam. The plotting loci shown in FIG. 4 are realized by moving a stage that is mounted with a mask in the X-direction while reciprocating a beam in the Y-direction with a prescribed amplitude. Such a plotting method makes it possible to form a mask pattern (a region 38 in FIG. 4) while performing a plotting operation on the entire mask on a band-shaped region basis, the band-shaped regions (regions 34 and 36 in FIG. 4) being called stripes.

Next, a photolithography mask 40 according to the first embodiment of the invention will be described with reference to FIGS. 5 and 6A to 6B.

Figure 5:
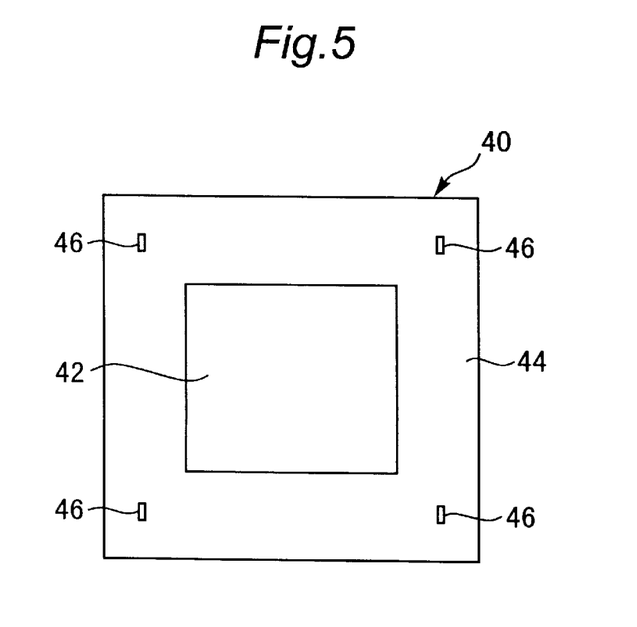
FIG. 5 is a plan view of the photolithography mask according to a first embodiment of the present invention.

FIG. 5 is a plan view of the photolithography mask 40 according to this embodiment. The photolithography mask 40 has a functional pattern region 42 and a non-functional pattern region 44. The functional pattern region 42 is a region where functional patterns that are necessary to realize the functions of a semiconductor device are to be formed. The non-functional pattern region 44 is a region where patterns that do not influence the functions of the semiconductor device can be formed. The non-functional pattern region 44 is provided with monitoring mark regions 46, where monitoring marks as the main portions of the photolithography mask 40 are to be formed.

Figure 6A:
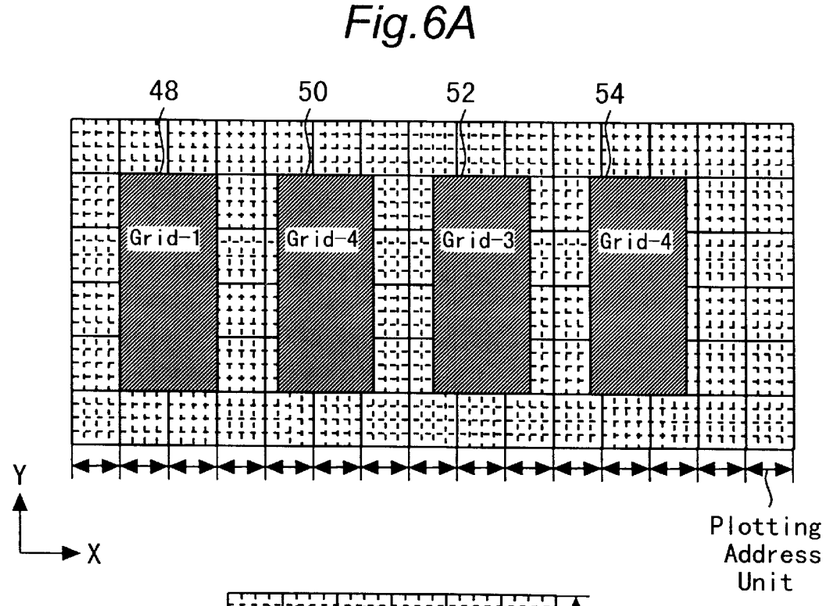
FIGS. 6A and 6B are plan views showing monitor patterns formed on the photolithography mask according to the first embodiment of the present invention.
Figure 6B:
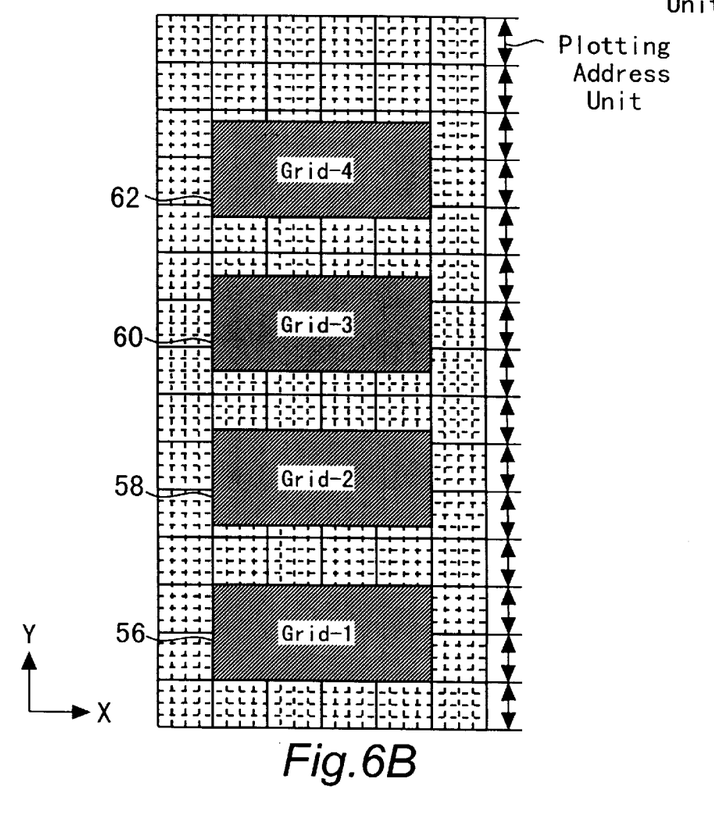

Each of FIGS. 6A and 6B shows monitoring marks formed on the photolithography mask 40. The monitoring marks shown in FIG. 6A and those shown in FIG. 6B may be formed in the same monitoring mark region 46 or different monitoring mark regions 46.

The monitoring marks shown in FIG. 6A include four (N) monitoring marks 48, 50, 52, and 54 having the same size. The four monitoring marks 48, 50, 52, and 54 have pattern edges to be depicted by using the same plotting grid (i.e., Grid-1) at the ends in the Y-direction (the top and bottom ends in FIG. 6A), and pattern edges to be formed by using different plotting grids (i.e., any of Grid-1 to Grid-4) at the ends in the X-direction (the right and left ends in FIG. 6A).

The monitoring marks shown in FIG. 6B include four (N) monitoring marks 56, 58, 60, and 62 having the same size. The four monitoring marks 56, 58, 60, and 62 have pattern edges to be depicted by using the same plotting grid (i.e., Grid-1) at the ends in the X-direction (the right and left ends in FIG. 6B), and pattern edges to be formed by using different plotting grids (i.e., any of Grid-1 to Grid-4) at the ends in the Y-director (the top and bottom ends in FIG. 6B).

All the monitoring marks 48–62 shown in FIGS. 6A and 6B are plotted and then developed together with functional patterns to be formed in the functional pattern region 42, thereby being formed on the photolithography mask 40. The monitoring marks 48–62 formed on the mask 40 are thereafter subjected to a dimension measurement by a known pattern dimension measuring instrument.

Specifically, the four monitoring marks 48–54 shown in FIG. 6A are subjected to a measurement of pattern lengths in the X-direction. Dispersion of measurement results corresponds to dispersion of pattern lengths in the X-direction due to the use of different plotting grids. It is considered that such dispersion of pattern lengths also occurs in the functional patterns in the functional pattern region 42. Therefore, the photolithography mask 40 according to this embodiment makes it possible to accurately monitor dispersion of dimension in the X-direction that occurs in the functional patterns due to the use of different plotting grids.

On the other hand, the four monitoring marks 56–62 shown in FIG. 6B are subjected to a measurement of pattern lengths in the Y-direction. Dispersion of measurement results corresponds to dispersion of pattern lengths in the Y-direction due to the use of different plotting grids. It is considered that such dispersion of pattern lengths also occurs in the functional patterns in the functional pattern region 42. Therefore, the photolithography mask 40 according to this embodiment makes it possible to accurately monitor dispersion of dimension in the Y-direction that occurs in the functional patterns due to the use of different plotting grids.

Once dispersion of dimension due to the use of different plotting grids is monitored, it becomes possible to modify pattern designs or conditions in the plotting step or the development step based on monitoring results. Such modification is effective in increasing the yield of the semiconductor device and stabilizing its quality. Therefore, the photolithography mask 40 according to this embodiment is useful for manufacturing a semiconductor device at a high yield with stabilized quality.

Although in the first embodiment the four monitoring marks are arranged in each of the X-direction and the Y-direction, the invention is not limited to such a case. In the first embodiment, the four monitoring marks are provided because the address unit ratio N is four and hence four kinds of plotting grids are needed for pattern plotting. If the address unit ratio N is a number other than four, the number of monitoring marks may be set equal to the number N.

Second Embodiment

A photolithography mask according to a second embodiment of the invention will be described with reference to FIG. 7.

Figure 7:
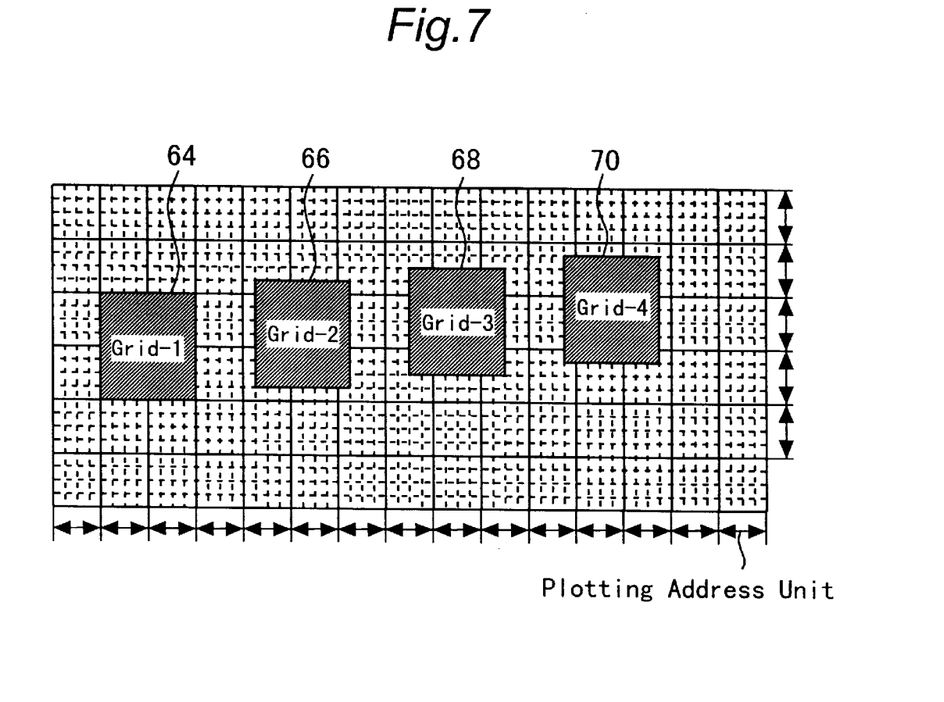
FIG. 7 is a plan view showing monitor patterns formed on a photolithography mask according to a second embodiment of the present invention.

FIG. 7 shows monitoring marks that are provided in the photolithography mask according to this embodiment. The mask according to this embodiment has the same structure as in the first embodiment except that the former is provided with the monitoring marks shown in FIG. 7 instead of the monitoring marks shown in FIGS. 6A and 6B.

The monitoring marks shown in FIG. 7 include four (N) monitoring marks 64, 66, 68, and 70 having the same size. The four monitoring marks 64, 66, 68, and 70 have pattern edges to be formed by using different plotting grids (any of Grid-1 to Grid-4) at each of the ends in the X-direction (the right and left ends in FIG. 7) and the ends in the Y direction (the top and bottom ends in FIG. 7).

After being formed on the mask together with functional patterns, the four monitoring marks 64–70 shown in FIG. 7 are subjected to a measurement of pattern lengths in the X-direction and the Y-direction by a known pattern dimension measuring instrument. Dispersion of measurement results in the X-direction corresponds to dispersion of pattern lengths in the X-direction due to the use of different plotting grids. Similarly, dispersion of measurement results in the Y-direction corresponds to dispersion of pattern lengths in the Y-direction due to the use of different plotting grids.

Therefore, the photolithography mask according to this embodiment makes it possible to monitor dispersion of pattern lengths due to the use of different plotting grids in both of the X-direction and Y-direction by using only the four monitoring marks 64–70. Therefore, with the structure according to this embodiment, dispersion of pattern dimension can be monitored more efficiently than in the first embodiment.

Although in the second embodiment the number of monitoring marks is four, in the invention it is not limited to four and may be greater than or equal to the address unit ratio N. Further, although in the second embodiment the monitoring marks 64–70 are made squares to enable efficient and highly accurate measurement of dimensions in the X-direction and the Y-direction, the shape of monitoring marks is not limited to a square and may be a rectangle.

Third Embodiment

A photolithography mask according to a third embodiment of the invention will be described with reference to FIG. 8.

Figure 8:
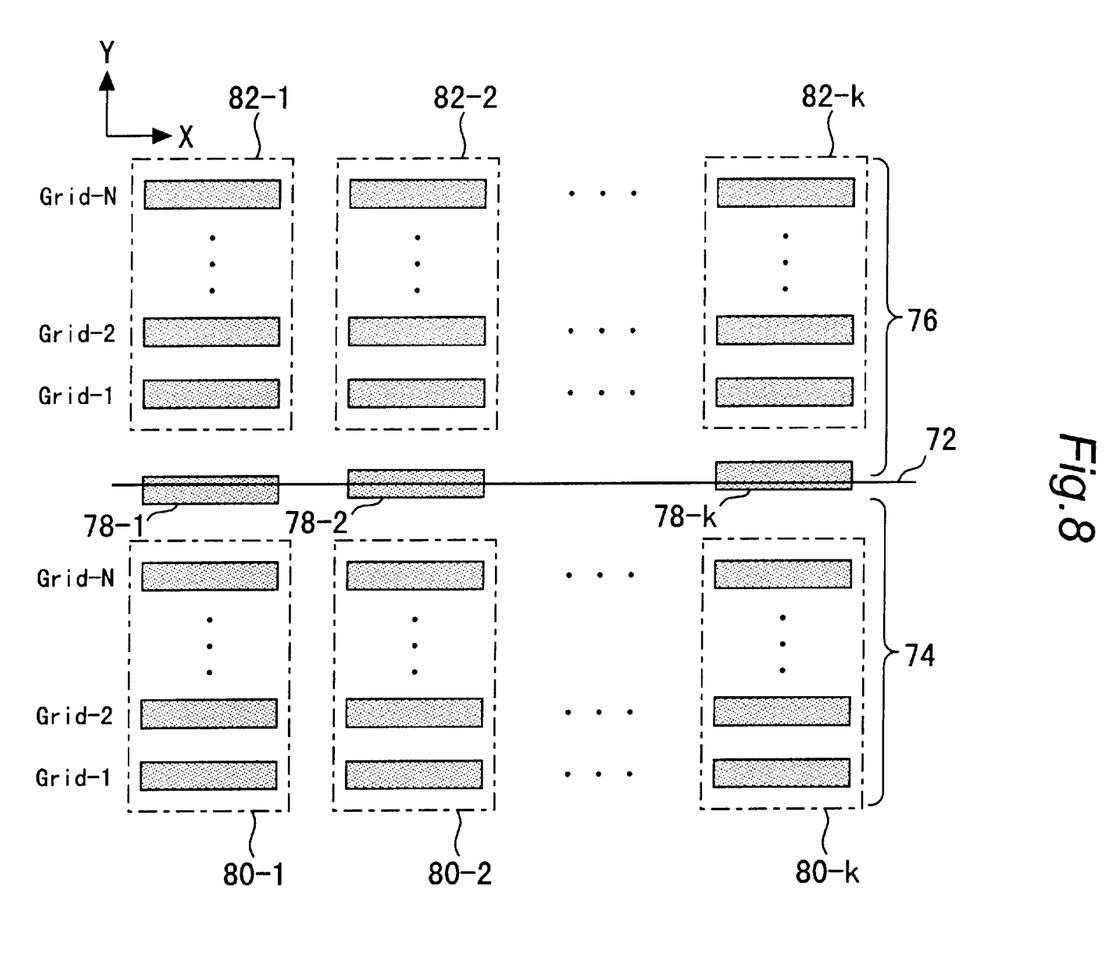
FIG. 8 is a plan view showing monitor patterns formed on a photolithography mask according to a third embodiment of the present invention.

FIG. 8 shows monitoring marks that are provided in the photolithography mask according to this embodiment. The mask according to this embodiment has the same structure as in the first embodiment except that the former is provided with the monitoring marks shown in FIG. 8 instead of the monitoring marks shown in FIGS. 6A and 6B.

A straight line 72 shown in FIG. 8 is a boundary line between a first stripes 74 and a second stripe 76. The monitoring marks shown in FIG. 8 include monitoring marks 78-i (i=1 to k) that overlap with the boundary line 72. The monitoring marks 78-i are designed so that ratios of the portion belonging to the first stripe 74 to that belonging to the second stripe 76 are different, respectively. Specifically, the monitoring mark 78-1 is provided in such a manner that its portion belonging to the first stripe 74 is larger than that belonging to the second stripe 76. The monitoring mark 78-k is provided in such a manner that its portion belonging to the first stripe 74 is smaller than that belonging to the second stripe 76. This ratio will be hereinafter called a "pattern formation ratio."

The accuracy of the monitoring marks 78-i that bridge the two stripes 74 and 76 is greatly influenced by the accuracy of connection of the two stripes 74 and 76 at their boundary. Each of the monitoring marks 78-i includes a pattern edge that is formed during plotting in the first stripe 74 and a pattern edge that is formed during plotting in the second stripe 76. The accuracy of such a pattern edge is apt to be more influenced by the accuracy of the stripe connecting portion as its position comes closer to the boundary line 72.

The distance between such a pattern edge and the boundary line 72 is determined by the proportions of the portions of each monitoring mark 78-i that belong to the two respective stripes 74 and 76, that is, the pattern formation ratio of each monitoring mark 78-i. Therefore, the accuracy of such a pattern edge, that is, the accuracy of dimension in the Y-direction of the monitoring mark 78-i, varies with its pattern formation ratio.

Functional patterns formed in the functional pattern region of a photolithography mask include ones bridging two stripes like the monitoring marks 78-i do. Like the accuracy of dimension of the monitoring marks 78-i, the accuracy of dimension of such functional patterns are influenced by the accuracy of connection of the two stripes and varies with the proportions of the portions of such functional patterns that belong to the two respective stripes. Therefore, to manage the dimensions of such functional patterns accurately, it is necessary to correctly recognize dispersion of dimension that depends on the stripe connecting accuracy and dispersion of dimension that depends on differences in pattern formation ratio.

The dimensions of the monitoring marks 78-i in the Y-direction include dispersion due to differences in pattern formation ratio. Therefore, the dispersion of dimension due to differences in pattern formation ratio can be monitored by comparing the dimensions of the monitoring marks 78-i in the Y-direction.

On the other hand, all dimensions of the monitoring marks 78-i in the Y-direction are influenced by the stripe connecting accuracy. Therefore, the influence of the stripe connecting accuracy cannot be recognized by merely comparing the dimensions of the monitoring marks 78-i. In view of this, as shown in FIG. 8, a plurality of monitoring marks 80-i and a plurality of monitoring marks 82-i are formed under and over each of monitoring marks 78-i (i=1 to k)in the photolithography mask according to this embodiment.

The monitoring marks 80-i are formed during plotting in the first stripe 74. The monitoring marks 80-i include monitoring marks to be plotted by using N kinds of plotting grids (i.e., Grid-1 to Grid-N for shifting edges in the Y-direction). On the other hand, the monitoring marks 82-i are formed during plotting in the second stripe 76. The monitoring marks 82-i include monitoring marks to be plotted by using N kinds of plotting grids (i.e., Grid-1 to Grid-N for shifting edges in the Y-direction).

After being formed on the mask together with functional. patterns, all the monitoring marks shown in FIG. 8 are subjected to a measurement of pattern widths in the Y-direction by a known, pattern dimension measuring instrument. In the following, measurement results of the monitoring marks 78-i (i=1 to k) are represented by W(78-i) by using the reference numerals of the respective monitoring marks 78-i. A measurement result of each of the monitoring marks 80-i and 82-i (i=1 to k) is represented by W(80-i, Gj) or W (82-i, Gj) (j=1 to N) by using the reference numerals of a monitoring mark 80-i or 82-i and the number of a plotting grid for plotting the monitoring mark.

In this embodiment, after completion of the above measurement, a calculation for determining dispersion of dimension due to the stripe connecting accuracy is performed for each monitoring pattern 78-i. For example, for the monitoring pattern 78-1, the absolute value of a result of the following equation is calculated.

$$\{W(80\text{-}1, G1)+ \ldots +W(80\text{-}1, GN)+W(82\text{-}1, G1)+ \ldots +W(82\text{-}1, GN)\}/2N - W(78\text{-}1)$$

The above calculation is performed for all monitoring patterns 78-i. The above calculation makes it possible to eliminate a difference in dimension due to differences in plotting conditions between the stripes and a difference in dimension due to the use of different plotting grids from the dimension W(78-i) in the Y-direction of each monitoring pattern 78-i, to thereby accurately determining a difference in dimension due to the stripe connecting accuracy. Further, by comparing resulting differences in dimension with each other, differences in dimension due to differences in pattern formation ratio among the monitoring patterns 78-i can be determined accurately. Therefore, the photolithography mask according to this embodiment makes it possible to accurately monitor, for each pattern formation ratio, dispersion of dimension that occurs in each functional pattern being influenced by the stripe connecting accuracy.

Fourth Embodiment

A photolithography mask according to a fourth embodiment of the invention will be described with reference to FIG. 9.

Figure 9:
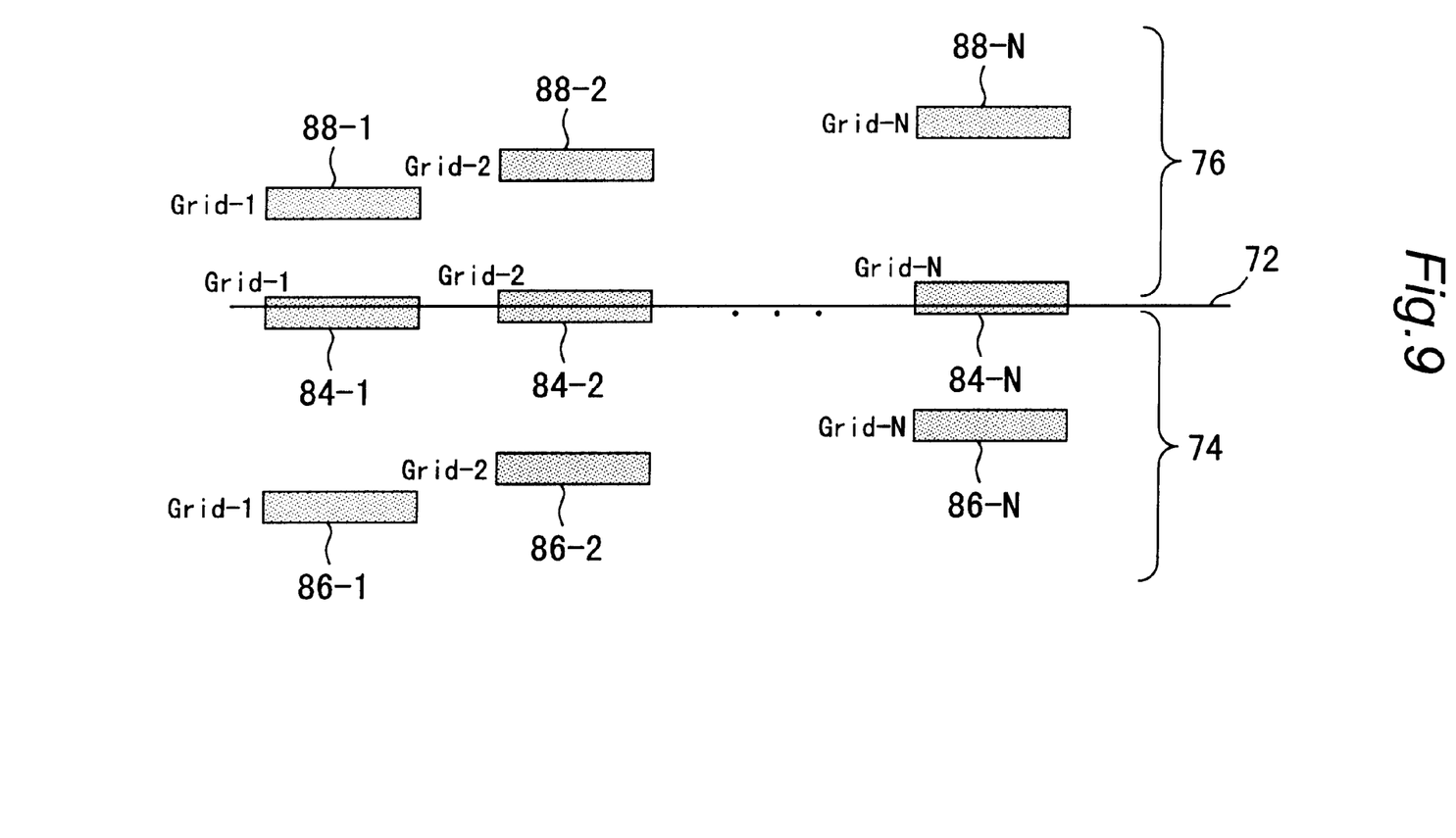
FIG. 9 is a plan view showing monitor patterns formed on a photolithography mask according to a fourth embodiment of the present invention.

FIG. 9 shows monitoring marks that are provided in the photolithography mask according to this embodiment. The mask according to this embodiment has the same structure as in the first embodiment except that the former is provided with the monitoring marks shown in FIG. 9 instead of the monitoring marks shown in FIGS. 6A and 6B.

The monitoring marks shown in FIG. 9 include monitoring marks 84-i (i=1 to N) that are provided in the same number as the address unit ratio N so as to overlap with the boundary line 72. The monitoring marks 84-i are designed so as to have different pattern formation ratios and as to be plotted by using different plotting grids. Specifically, the monitoring mark 84-1 is provided so as to be included in a first stripe 74 at a larger proportion than in a second stripe 76 and as to be plotted by using Grid-1. The monitoring mark 84-N is provided so as to be included in the first stripe 74 at a smaller proportion than in the second stripe 76 and as to be written by using Grid-N.

Monitoring marks 86-1 and 88-1 are formed under and over the monitoring mark 84-1. The monitoring mark 86-1 is formed during plotting in the first stripe 74. On the other hand, the monitoring mark 88-1 is formed during plotting in the second stripe 76. Both of the monitoring marks 86-1 and 88-1 are to be written by using Grid-1 like the monitoring mark 84-1 is. Under and over the monitoring marks 84-2 to 84-N are monitoring marks 86-2 to 86-N and 88-2 to 88-N in such a way that the monitoring marks 84-i, 86-i and 88-i (i=2 to N) are formed by using the same kind of plotting grid, respectively.

After being formed on the mask together with functional patterns, the monitoring marks shown in FIG. 9 are subjected to a measurement of pattern widths in the Y-direction by a known pattern dimension measuring instrument. In the following, measurement results will be represented by W(84-i), W(86-i), and W(88-i) by using the reference numerals of the respective monitoring marks.

In this embodiment, after completion of the above measurement, dispersion of dimension due to the stripe connecting accuracy is calculated for each monitoring pattern 84-i. For example, for the monitoring pattern 84-1, the absolute value of a result of the following equation is calculated.

$$\{W(86\text{-}1)+W(88\text{-}1)\}/2-W(84\text{-}1)$$

The above calculation is performed for all monitoring patterns 84-i. The above calculation makes it possible to eliminate a difference in dimension due to differences in plotting conditions between the stripes and a difference in dimension due to the use of different plotting grids from the dimension W(84-i) in the Y-direction of each monitoring pattern 84-i, to thereby accurately determining a difference in dimension due to the stripe connecting accuracy. Further, by comparing resulting differences in dimension with each other, differences in dimension due to differences in pattern formation ratio among the monitoring patterns 84-i can be determined accurately. Therefore, the photolithography mask according to this embodiment makes it possible to accurately monitor, for each pattern formation ratio, dispersion of dimension that occurs in each functional pattern being influenced by the stripe connecting accuracy.

Constituted as described above, the invention provides the following advantages.

According to the first aspect of the present invention, there are formed monitoring marks corresponding to all plotting grids that are necessary for plotting of mask patterns. Therefore, according to the present invention, by measuring the dimensions of the respective monitoring marks, deviation of dimension of all the mask patterns can be monitored while differences among plotting grids are taken into consideration.

According to the second aspect of the present invention, the monitoring marks may be given the same size and shape. In this case, the dimensions of the monitoring marks can be compared with each other in a simple manner.

According to the third aspect of the present invention, pattern length dispersion in the X-direction and that in the Y-direction can be monitored by using the different sets of monitoring marks.

According to the fourth aspect of the present invention, pattern length dispersion in the X-direction and that in the Y-direction can be monitored by using the common monitoring marks.

According to the fifth aspect of the present invention, it is possible to monitor the accuracy of functional patterns formed at the boundary between two stripes by measuring the dimensions of the on-boundary monitoring marks. Further, since the on-boundary monitoring marks are provided so as to have different pattern formation ratios, the accuracy of patterns bridging two stripes can be monitored while differences among the pattern formation ratios are taken into consideration.

According to the sixth present of the present invention, monitoring marks corresponding to all plotting grids are formed on each side of the on-boundary monitoring marks. In this case, the accuracy of connection of two stripes can be monitored accurately by comparing the dimensions of those monitoring marks with each other.

According to the seventh aspect of the present invention, the on-boundary monitoring marks may be given different pattern formation ratios by plotting the on-boundary monitoring marks by using different plotting grids. This makes it possible to monitor the sum of dispersion of dimension due to differences in pattern formation ratio and dispersion of dimension due to the use of different plotting grids by measuring the dimensions of the on-boundary monitoring marks.

According to the eighth aspect of the present invention, monitoring marks corresponding to all plotting grids are formed on each side of the on-boundary monitoring marks. Provided that the dimensions of the monitoring marks are compared with those of the on-boundary monitoring marks, the dispersion of dimension due to use of different plotting grid are eliminated, whereby there is ensured an accurate monitoring of the dispersion of dimension due to only differences in pattern formation ratio.

Further, the present invention is not limited to these embodiments, but variations and modifications may be made without departing from the scope of the present invention.

The entire disclosure of Japanese Patent Application No. Hei 11-352046 filed on Dec. 10, 1999 including specification, claims, drawings and summary are incorporated herein by reference in its entirety.

What is claimed is:

1. A photolithography mask comprising:
   mask patterns that are designed on a data address unit basis; and
   monitoring marks corresponding to all plotting grids, respectively, that are necessary in plotting the mask patterns by using a prescribed plotting address unit that is larger than the data address unit;
   wherein pattern edges that are plotted by using all different plotting grids are distributed to the monitoring marks, respectively.

2. The photolithography mask according to claim 1, wherein the monitoring marks have the same size and shape.

3. The photolithography mask according to claim 1, wherein:

all the plotting grids include X-direction-related plotting grids that are necessary in plotting pattern edges at arbitrary positions in the X-direction and Y-direction-related plotting grids that are necessary in plotting pattern edges at arbitrary positions in the Y-direction;

the monitoring marks include X-direction-related monitoring marks of the same number as the X-direction-related plotting grids as well as Y-direction-related monitoring marks of the same number as the Y-direction-related plotting grids;

pattern edges that are plotted by using all different X-direction-related plotting grids are distributed to the X-direction-related monitoring marks, respectively; and pattern edges that are plotted by using all different Y-direction-related plotting grids are distributed to the Y-direction-related monitoring marks, respectively.

4. The photolithography mask according to claim 1, wherein:

all the plotting grids include X-direction-related plotting grids that are necessary in plotting pattern edges at arbitrary positions in the X-direction and Y-direction-related plotting grids that are necessary in plotting pattern edges at arbitrary positions in the Y-direction;

the monitoring marks include monitoring marks of the same number as the X-direction-related plotting grids, i.e., as the Y-direction-related plotting grids; and pattern edges that are plotted by using all different X-direction-related plotting grids and pattern edges that are plotted by using all different Y-direction-related plotting grids are distributed to the monitoring marks, respectively.

5. A photolithography mask comprising:

a plurality of stripe regions having a prescribed width and formed in contiguous relation to each other, each of the stripe regions corresponding to a unit for proceeding a plotting process; and a plurality of on-boundary monitoring marks that overlap with a boundary line between a first stripe region and a second stripe region, the plurality of on-boundary monitoring marks being provided so that each on-boundary monitoring mark is different in the ratio between a portion formed in the first stripe region and a portion formed in the second stripe region from the other on-boundary monitoring marks.

6. The photolithography mask according to claim 5, further comprising:

mask patterns that are designed on a data address unit basis; and monitoring marks corresponding to all plotting grids, respectively, that are necessary in plotting the mask patterns by using a prescribed plotting address unit that is larger than the data address unit, the monitoring marks having pattern edges that are plotted by using different plotting grids, the monitoring marks being formed in each of the first stripe region and the second stripe region.

7. The photolithography mask according to claim 5, further comprising:

mask patterns that are designed on a data address unit basis; and monitoring marks corresponding to all plotting grids, respectively, that are necessary in plotting the mask patterns by using a prescribed plotting address unit that is larger than the data address unit, wherein the on-boundary monitoring marks have pattern edges that are parallel with the boundary line and are plotted by using different plotting grids.

8. The photolithography mask according to claim 7, wherein the monitoring marks are formed in both of the first stripe region and the second stripe region.

9. A manufacturing method of a photolithography mask having mask patterns that are designed on a data address unit basis, comprising the steps of:

plotting the mask patterns by using a prescribed plotting address unit that is larger than the data address unit; and plotting monitoring marks that corresponds to all plotting grids, respectively, that are necessary for plotting of the mask patterns so that pattern edges that are plotted by using all different plotting grids are distributed to the monitoring marks, respectively.

10. The manufacturing method of a photolithography mask according to claim 9, wherein the monitoring marks plotting step plots the monitoring marks so that they have the same size and shape.

11. The manufacturing method of a photolithography mask according to claim 9, wherein:

all the plotting grids include X-direction-related plotting grids that are necessary in plotting pattern edges at arbitrary positions in the X-direction and Y-direction-related plotting grids that are necessary in plotting pattern edges at arbitrary positions in the Y-direction;

the monitoring marks plotting step includes a substep of plotting X-direction-related monitoring marks of the same number as the X-direction-related plotting grids and a substep of plotting Y-direction-related monitoring marks of the same number as the Y-direction-related plotting grids;

pattern edges that are plotted by using all different X-direction-related plotting grid are distributed to the X-direction-related monitoring marks, respectively; and pattern edges that are plotted by using all different Y-direction-related plotting grid are distributed to the Y-direction-related monitoring marks, respectively.

12. The manufacturing method of a photolithography mask according to claim 9, wherein:

all the plotting grids include X-direction-related plotting grids that are necessary in plotting pattern edges at arbitrary positions in the X-direction and Y-direction-related plotting grids that are necessary in plotting pattern edges at arbitrary positions in the Y-direction;

the monitoring marks plotting step includes a substep of plotting monitoring marks of the same number as the X-direction-related plotting grids, i.e., as the Y-direction-related plotting grids; and pattern edges that are plotted by using all different X-direction-related plotting grids and pattern edges that are plotted by using all different Y-direction-related plotting grids are distributed to the monitoring marks, respectively.

* * * * *